United States Patent [19]

Landsmann et al.

[11] Patent Number: 5,055,635
[45] Date of Patent: Oct. 8, 1991

[54] ARRANGEMENT FOR IMPROVING ELECTROMAGNETIC COMPATABILITY OF ELECTRICAL DEVICE

[75] Inventors: Gerhard Landsmann, Eberdingen; Gerhard Soehner, Geradstetten, both of Fed. Rep. of Germany

[73] Assignee: Robert Bosch GmbH, Stuttgart, Fed. Rep. of Germany

[21] Appl. No.: 525,873

[22] Filed: May 17, 1990

[30] Foreign Application Priority Data

May 24, 1989 [DE] Fed. Rep. of Germany ....... 3916898

[51] Int. Cl.$^5$ ............................................. H01B 7/34
[52] U.S. Cl. ...................................... 174/36; 174/27; 174/99 R; 333/244
[58] Field of Search ......................... 174/36, 99 R, 27; 333/244

[56] References Cited

U.S. PATENT DOCUMENTS

| 240,236 | 4/1881 | Delany | 174/99 R |
|---|---|---|---|
| 251,552 | 12/1881 | Edison | 174/99 R |
| 2,550,021 | 4/1951 | Rappl | 174/99 R X |
| 3,349,479 | 10/1967 | Sewell | 174/99 R |
| 3,928,714 | 12/1975 | Matchett | 174/99 R X |
| 4,316,052 | 2/1982 | Matsuda | 174/27 X |
| 4,352,949 | 10/1982 | Cookson | 174/99 R X |

FOREIGN PATENT DOCUMENTS 2263746 7/1974 Fed. Rep. of Germany .... 174/99 R

Primary Examiner—Morris H. Nimmo
Attorney, Agent, or Firm—Michael J. Striker

[57] ABSTRACT

An arrangement for improving the electromagnetic compatibility of an electrical device provided with an interference irradiation susceptible conduit, especially an electronic control device of an internal combustion engine of a power vehicle comprises at least one conductor, at least one conductor surrounded by a dielectric, at least one screen, a holding unit for holding the conductors at a predetermined, selectable distance from the screen in a mounting position, and a mass which forms the dielectric and surrounds the conductors in the mounting position.

18 Claims, 5 Drawing Sheets

ARRANGEMENT FOR IMPROVING ELECTROMAGNETIC COMPATABILITY OF ELECTRICAL DEVICE

BACKGROUND OF THE INVENTION

The present invention relates to an arrangement for improving the electromagnetic compatibility of an electrical device provided with an interference radiation-loaded connecting conduit.

For efficient operation of electrical, especially electronic devices, it is required to screen them from interference irradiation, especially in high frequency regions. It has been proposed to accommodate such sensitive devices in screen housings However, interferences which are passed through the connecting conductors of the electrical devices are not caught in this way.

The German document AS No.1,616,702 discloses an arrangement for screening of high frequency interferences extending from an electrical interference source and transmitted from it to the connecting conduit. The arrangement includes a conductor incorporated in the connecting conduit and surrounded by a thin ceramic layer with a thin silver coating on it. Thereby relative to the remaining connecting region, here characteristic wave impedance jump is produced in the conduit, so that the incoming interferences are reflected. Such a reflection has the disadvantage that the reflected interference energy is reflected to its source but not directly annihilated. Since the characteristic wave impedance of the known sieve member is fixedly predetermined, the reflection factor cannot be influenced.

SUMMARY OF THE INVENTION

Accordingly, it is an object of the present invention to provide an arrangement of the above mentioned general type, which avoids the disadvantages of the prior art.

In keeping with these objects and with others which will become apparent hereinafter, one feature of the present invention resides, briefly stated, in an arrangement for improving the electromagnetic compatibility of an electrical device, in which the conductor is held by a holding unit in a definite, selectable distance from the screen, and a dielectric-forming mass surrounds the conductor in its mounting position.

When the arrangement is designed in accordance with the present invention it has the advantage in that due to the value of selected distance from the screen and in dependence on the mass selected as dielectric, it is possible to adjust the capacity (capacitative coating) distributed between the conductor and the screen, over the length of the arrangement. The interferences propagating through the connecting conduit in the inventive arrangement are withdrawn through the capacitative coating, and therefore the interference energy does not reach the electrical device to be protected. Due to the spatially distributed capacity, it is insured that the wave loop of the formed standing interference waves is caught and their energy is withdrawn. Best results are obtained when the capacity of the inventive arrangement corresponds to the input impedance of the electrical device. The possibility of the distance variation of the conductors relative to the screen due to the inventive holding device, and the individual selection of the dielectric-forming mass, makes possible such an adjustment in a simple manner.

In accordance with the present invention, the conductor is first mounted at the desired distance in the holding device and then embedded in the dielectric-forming mass. The mass can be composed of a material which maintains its elastic properties over a long time, or of a material which is deformable during the pre-processing and then solidifies.

Depending on the type of the mass and/or its components, an adjustment of the dielectric constant is possible so as to influence the capacity value. It is a specific feature of the inventive arrangement that it can be individually adapted by its adjustment to the required conditions.

In accordance with another advantageous feature of the present invention, the dielectric-forming mass is injection molded on the conductors. Polypropylene can be used for this purpose. It can be injected in liquid or pasty condition in the intermediate space between the conductors and the screen. Polypropylene has a relatively high dielectric constant, so that the capacitative coating assumes a corresponding high value. An increase of the dielectric constant is also possible for example by admixing ceramic powder or granulate.

Electrical devices which are sensitive to electromagnetic interferences are frequently provided with several inputs. When the connecting conduit has a corresponding number of conductors or leads, they are arranged in accordance with the present invention at different distances from the screen depending upon the input impedance of the electrical device. The holding unit provides for various possibilities for the positioning of the conductors. This leads to corresponding distances of the conductors from the screen and therefore to different capacities. Thereby an adaptation of the respective capacity to the impedance of the associated input of the electrical device is possible.

In accordance with a further embodiment of the present invention, the holding device includes a plurality of holders spaced from one another. The holders are arranged along the laying path of the connecting conduit and receive the conductor or conductors. The supporting points, similarly to a free conductor are formed, between which the conductors are freely suspended prior to the embedding in the dielectric-forming mass.

Preferably the arrangement is formed so that the holding unit is mounted on the screen. For this purpose the screen can have recesses or projections for mounting the holders, preferably by clamping.

For mounting of the conductors on the holders, several receiving openings are provided on the holders. During the mounting, a threading of the conductors through the receiving openings is required.

Alternatingly, it is also possible to provide the holders with edge-open openings, in which the conductors can be clamped. During bringing the conductors into such openings, the opening cross-section expands, and after clamping the opening returns to its initial size due to the elasticity of the respective holder region. Thereby, an undesired loosening of the conductors from the openings is prevented. Alternatingly, it is also possible to provide the holders with a closure element, so that after inserting the conductors into the respective edge-open openings, the closure element closes or reduces the mouth of the opening.

In accordance with a preferable embodiment of the invention, the conductors of a connecting conduit are arranged in the offset receiving openings or depressions of respective holders so that their distance from the screen is varied. Thereby the value of the capacitative coating is changed, since due to the offset arrangement of the conductors over their length, different distances from the screen are produced.

In accordance with still a further embodiment of the invention, the screen can be formed as a chassis part of a power vehicle. When the electrical device is for example an electronic control device of an internal combustion engine of the vehicle, the conductors of the connecting conduit extending from a sensor (for example speed sensor) can be arranged inside the chassis parts at a distance predetermined by the holding unit. Then the hollow space formed between the conductors and the chassis part can be filled with the dielectric forming mass. The injection molding mass performs several functions. On the one hand, it forms the dielectric corrosion protection by preventing the penetration of moisture into the respective chassis part and moreover performs noise damping functions.

It is possible to use available, hollow-profile-shaped chassis parts as the above mentioned screen. Preferably, a brace or a wall of a reinforcing profile, especially a sheet bead and the like can be used as the screen.

A further possibility for adjustment is achieved when in accordance with the present invention the screen is provided with at least one window or the like for adapting the capacity or inductivity of the conductors to the input impedance of the electrical device. When a connecting conduit is provided with only one conductor, then in accordance with the present invention, in the region of the window it has a lower capacitative coating then in the window-free screening region. The window can be arranged in the initial portion of the conduit, at the end of the conduit or in its intermediate region. It is especially possible to extend the window over the whole length of the capacitative coating. This is provided for example when the screen does not completely surround the conductor but instead has a free longitudinal strip region, for example in the case of a sheet bead. In a surprising manner it has been shown that such a window can be used for controlling the capacitative coating design, and at the same time provides for a barrier for irradiating interference energy. Finally, the screen can be composed of a ferromagnetic material. For this purpose the above mentioned chassis part of a power vehicle is suitable. The ferromagnetic material influences the inductive coating of the conductor or conductors. Thereby an influence of the characteristic wave impedance of the inventive arrangement is possible. At the same time the above described advantages of the capacitative coating or completely maintained. Moreover, the ferromagnetic material also performs the function of screening from magnetic fields.

The insignificant interference energy which irradiates in the conductors, for example in transition regions, is then withdrawn through the capacitative coating as described above.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawings.

DESCRIPTION OF THE PREFERRED EMBODIMENTS

Figure 1:
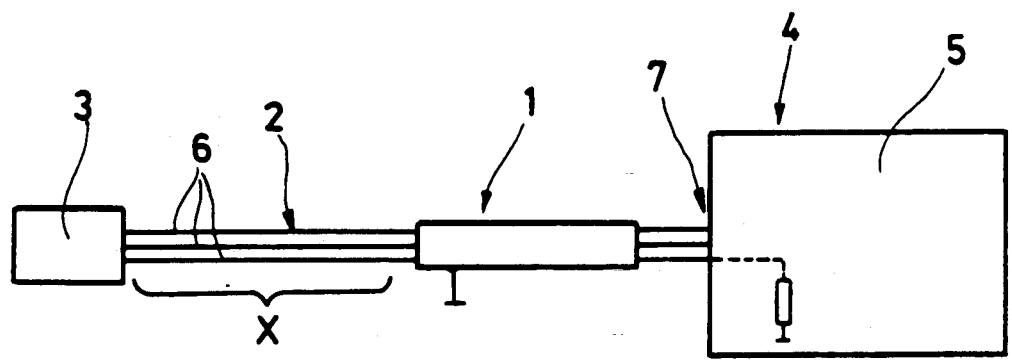
FIG. 1 is a view schematically showing an arrangement for improving compatibility of an electrical device in accordance with the present invention, together with a sensor and the electrical device formed as a control device.

As shown in FIG. 1, an arrangement for improving the electromagnetic compatibility identified with reference numeral 1 is located in a connecting conduit 2 which connects a sensor 3 with an electrical device 4. The sensor 3 is formed for example as a speed transmitter of an internal combustion engine of a power vehicle, while the electronic device 4 is formed as an electronic control device for igniting the internal combustion engine. The connecting conduit 2 has three conductors 6 provide with a corresponding isolation.

Figure 2:
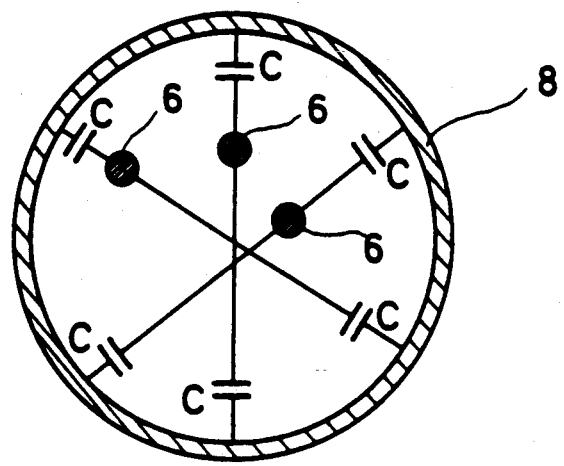
FIG. 2 is a view showing a section of the inventive arrangement in schematical illustration.

The arrangement 1 is provided in a connecting region 7 of the control device 5. As shown in FIG. 2, it has a screen 8 composed for example of flexible, electrically conductive tube. It can be formed as an electrically conductive synthetic plastic casing. The three conductors 6 are supported in the interior of the screen 8 by a holding device which will be explained later on and not shown in FIG. 2, so that they are located at a predetermined distance from the screen 8. The whole inner chamber of the screen 8 is filled with a dielectric-forming mass which is also not shown in FIG. 2.

Because of this construction, the arrangement 1 forms a capacitive layer. Each conductor 6 forms with the screen 8 the corresponding capacitive layer with a capacitive value depending on the distance of the conductor from the screen 8. In FIG. 2, each conductor 6 has two capacitors C which overlap the maximum and the minimum distance from the screen 8. These both capacitors C lie in parallel connection with one another. They embody in a pattern the whole capacity which each conductor 6 forms with the screen 8. In reality, starting from each conductor 6, a plurality of infinitely small capacitors are arranged in array-like manner and extend to the screen 8.

It is therefore believed to be clear that the capacitive coating of each conductor 6 can be adjusted by its individual arrangement inside the inner chamber of the screen 8. This capacity adjustment is performed in accordance with the present invention in dependence upon the input impedance of the input of the control device 5 associated with the respective conductor 6. In FIG. 1 this input impedance is shown for example for the lower conductor 6 with a broken line. Furthermore, it can be seen that both the input impedance and the screen 8 are connected with the mass.

As long as in the section x in FIG. 1 of the connecting conductor 2 a high frequency interference is radiated, standing interference wave form on this portion x, which without the inventive arrangement 1 can affect the operability of the control device 5. Due to the capacitive layer of the inventive arrangement, associated with each conductor 6, the interference waves are withdrawn to the mass. Thereby only the wanted signal is supplied from the sensor 3 to the connecting region 7 of the control device 5.

From the above mentioned it is believed to be clear that the inventive arrangement 1 must not extend over the whole longitudinal extension of the connecting conduit 2, for providing the desired function of interference suppression by withdrawing the interference energy to the mass. In accordance with another not shown embodiment it is also possible that the arrangement 1 extends over the whole length of the connecting conduit 2. Thereby a double effect is provided. The screen 8 acts as a Faraday-cage and therefore does not displace the substantial portion of the interference radiation to the connecting conduit 2. The insignificant interference energy irradiated into the conduit 6, for example at the transition regions, is withdrawn by the capacitive coating as described hereinabove.

Figure 3:
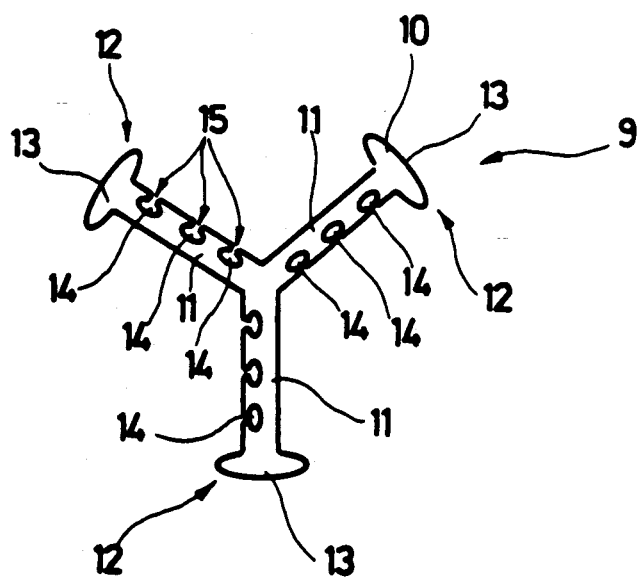
FIG. 3 is a view showing a holder of a holding unit for fixing a conductor in the inventive arrangement.

FIG. 3 shows the above mentioned holding device 9. It is composed of several holders 10 which are distributed over the length of the connecting conduit 2. Each holder has three holding arms 11 spaced from one another by 120°. Their first ends are connected integrally of one piece with one another so that they form a star. Their other ends 12 are provided with supporting feet 13 for supporting on the screen 8.

Each holding arm 11 has several openings 14 which are open at the edge of the arm. Their respective opening regions 15 are dimensioned relative to the diameter of the conductors 6 so that the conductors 6 can be engaged under pressure into the openings and tightly held there. The above mentioned plurality of the edge-open openings 14 makes possible the individual adjustment of the distance of the respective conductors 6 from the screen 8. Thereby influencing of the respective capacitative coating is possible. The opening 14 of one holding arm 11 can be offset relative to the opening of the other holding arm.

In assembled condition, the construction is such that the holders 10 which are spaced from one another and support the conductors 6, are accommodated in the interior of the screen 8. Preferably, the holders 10 and the screen 8 are arrested with one another. It is for this purpose possible to provide for example the inner wall of the screen 8 with respective arresting dents, between which the supporting feet 13 can engage.

Figure 4:
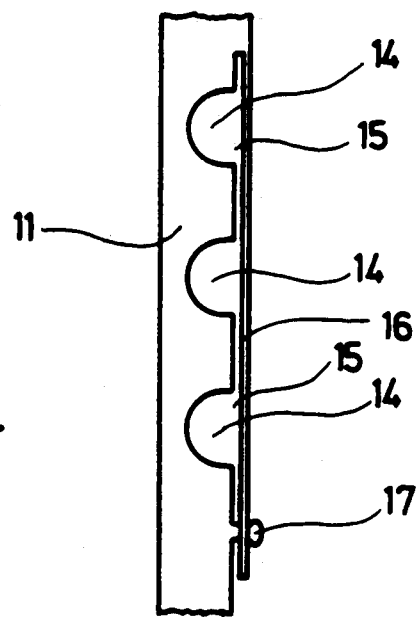
FIG. 4 is a view showing a detail of a further embodiment of a holder of the holding unit.

FIG. 4 shows another embodiment. This embodiment provides for a possibility that the shown portion of a holding arm 11 of the holders 10 can be provided with a recess 14 with opening regions which are at least as great as the diameter of the conductors 6. Here the above mentioned engagement or clipping can be avoided. The holding of the conductors 6 which is not shown in FIG. 4 is insured by a tongue 16. The tongue 16 is formed integrally of one piece with the holding arm 11 and can be arrested with a projection 17. The projection 17 has for this purpose a thickened head which engages in a corresponding opening of the tongue 16 with arresting fit. The tongue 16 closes the opening region 15 of the recesses 14 in a bridge-like manner. Therefore, a withdrawal of the conductors 6 is prevented. Preferably, the holding device 9 is composed of a yieldable, synthetic plastic material.

Figure 5:
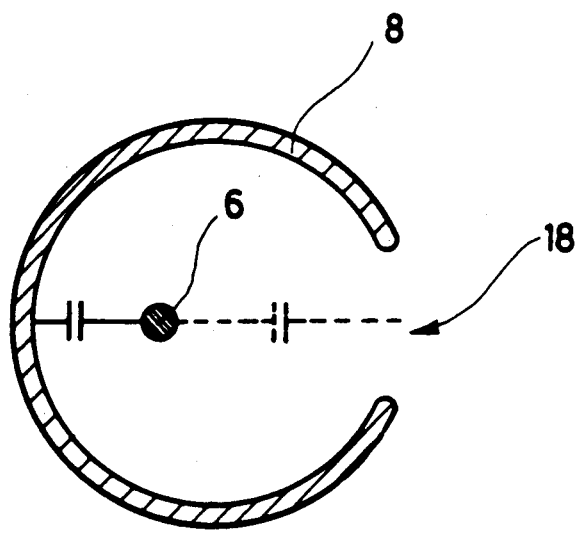
FIG. 5 is a view schematically showing the inventive arrangement with a not completely closed screen.

In accordance with a further embodiment of the invention as shown in FIG. 5, the screen 8 is provided with a window 18. The window is formed for example in a screen-free region. As a result, another value of the capacitative coating with respect to a closed system is produced. It can be seen from FIG. 5 that the capacity which overlaps the greater distance of the conductors 6 to the assumed extension of the screen 8 (shown in broken line) has a correspondingly smaller value. Due to the window 18, an adaptation of the capacitative coating to the respective input impedance of the control device 5 is possible.

Figure 6:
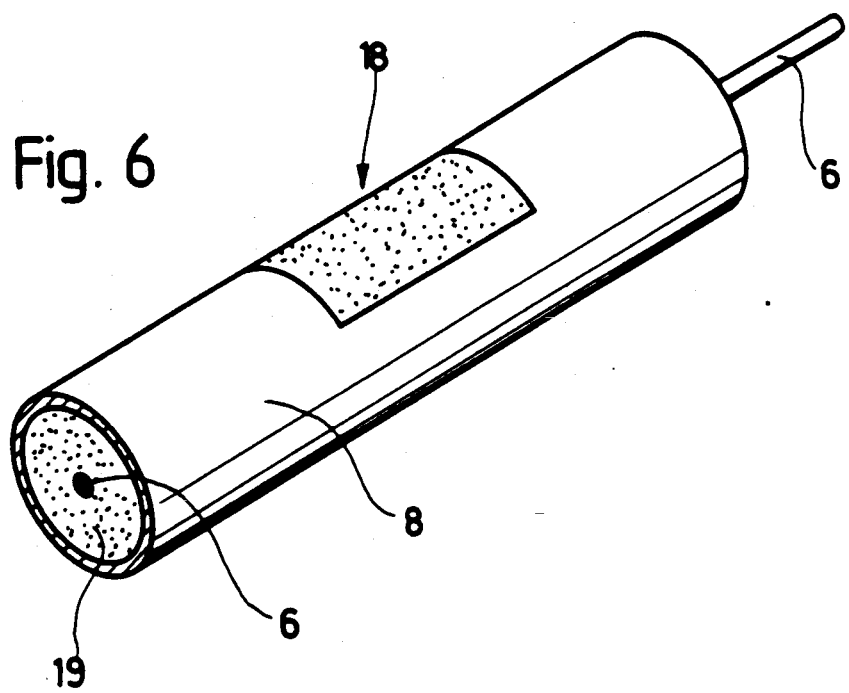
FIG. 6 is a view showing an example of the inventive arrangement with a screen which is interrupted by a window.

FIG. 6 shows the above described construction in perspective. The Figure illustrates that the inner chamber of the screen 8 is injected with a dielectric-forming mass 19. Further, the screen 8 is provided with a window 18. During manufacture of the inventive arrangement, the conductors 6 are first mounted on the holders 10 so that they assume the desired, definite position. Then, the holders are brought into the interior of the screen 8. Finally, the remaining hollow space is filled with the dielectric-forming mass 19, preferably by injection. Polypropylene can be used especially for the mass 19. During injection it has a liquid or pasty condition. Depending on the material selection, an adjustment of the dielectric constant is possible, so that the value of the desired capacity can be influenced. Also, admixtures which increase the dielectric constant can be added.

Figure 7:
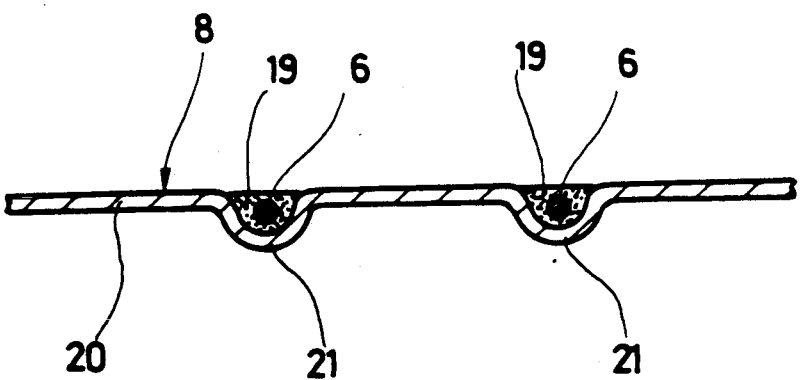
FIG. 7 is a sectional view showing a further embodiment in which the conductors are arranged in sheet beads.

Especially in the field of the vehicles, it is possible as shown in FIG. 7 to form the screen 8 by means of a chassis part 20. The chassis part 20 has beads 21. The conductors 6 with correspondingly designed holders are arranged in the beads and subsequently the available intermediate chamber is filled with the mass 19. The mass 19 can be composed of a continuously elastic sealing mass which is provided with admixtures for adjusting the corresponding dielectric constant.

Figure 8:
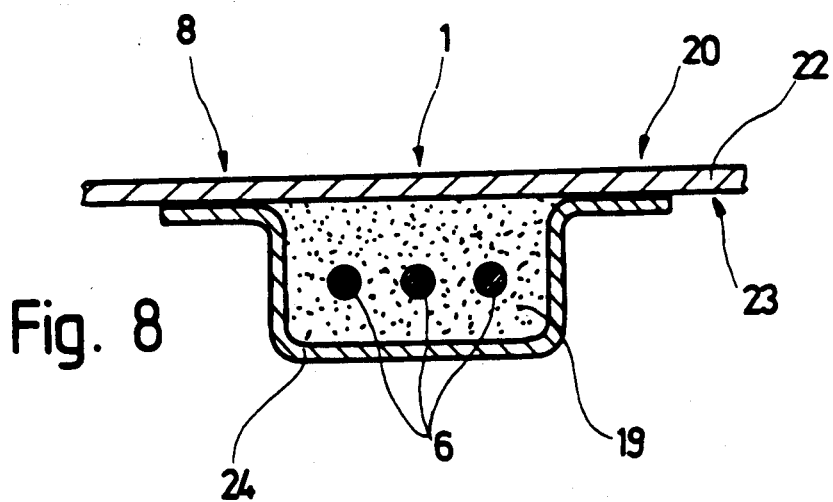
FIG. 8 is a view showing a section of a further embodiment of the inventive arrangement in which the conductors are arranged in a hollow space of a reinforcing profile of a power vehicle chassis.
Figure 9:
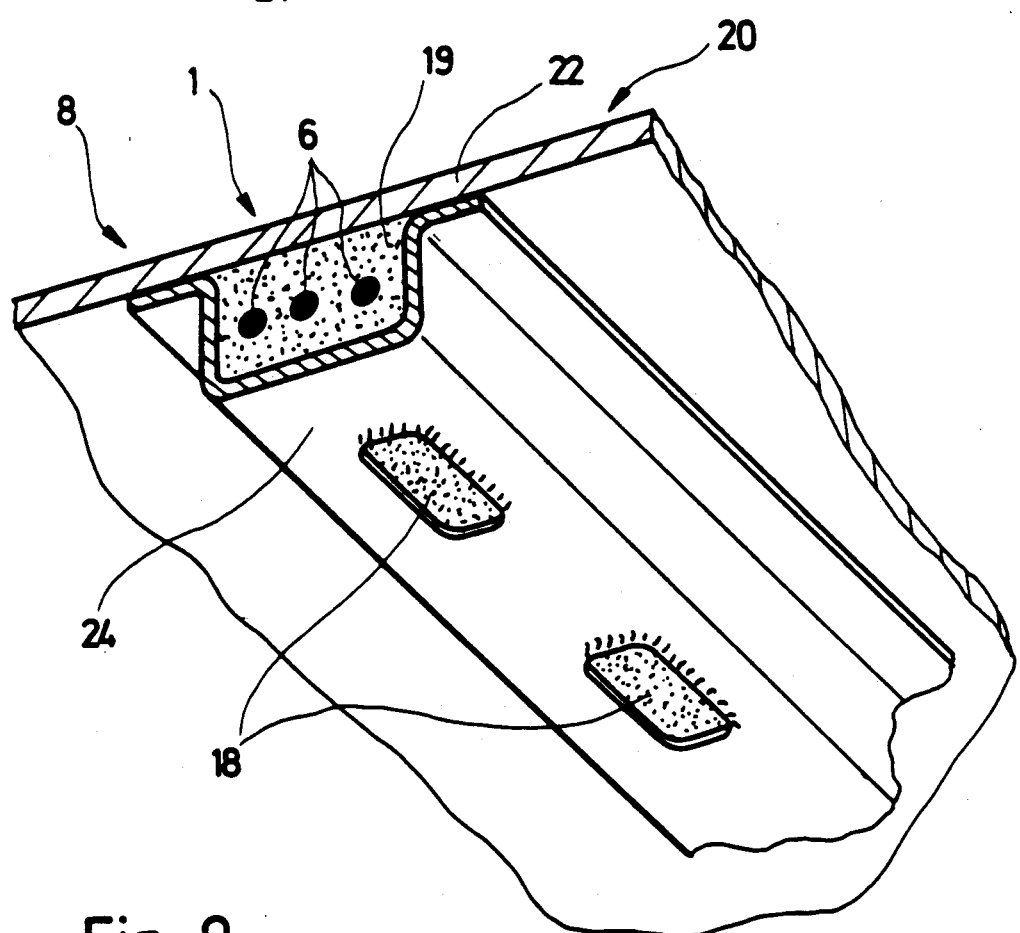
FIG. 9 is a perspective of the arrangement of FIG. 8.

FIGS. 8 and 9 show a further embodiment in which the conductors 6 are also arranged in hollow-profile-shaped chassis parts 20 of a power vehicle. In this case, for example it is a motor hood 22 which is provided at its lower side 23 with a U-shaped reinforcing profile 24. Such an arrangement is known in power vehicles. This structure can be used in accordance with the invention from the electrical point of view, in that corresponding holders can be mounted in the inner chamber of the reinforcing profile 24 closed by motor hood 22, as is not shown in the drawing. The conductors 6 can h=mounted on the holders. The remaining hollow space can be filled by injection with the above mentioned mass 19. The hollow-profile-shaped chassis parts 20 can be used therefore for forming the screen 8 of the inventive arrangement 1.

In accordance with a not shown embodiment, it is also possible to mount the conductors 6 in the above mentioned manner in a brace of the power vehicle.

When the screen 8 of the arrangement 1 is composed of a ferromagnetic material, it provides a protection against magnetic fields on the one hand, and also an influence on the characteristic wave impedance of the conductors 6. Therefore, by the capacitative coating and also by the inductive coating, an adjustment to the corresponding input impedance of the electrical device 4 is possible.

FIG. 9 shows that the reinforcing profile 24 is provided with windows 18. The windows 18 serve on the one hand for reinforcement due to their drilled edge regions. On the other hand, they provide for the above mentioned possibility of influencing the capacitative or inductive coating by the action of the window.

Figure 10:
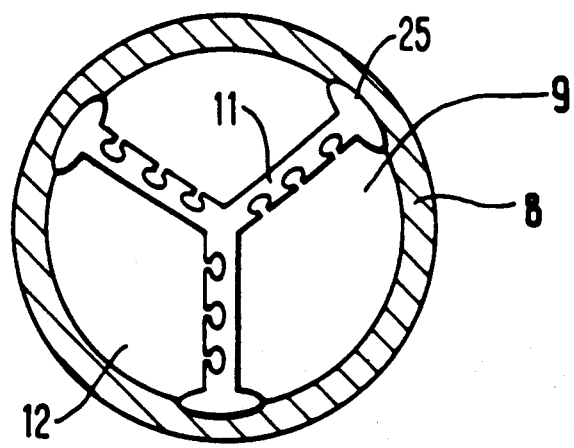
FIGS. 10 and 11 are views showing two further embodimens of the inventive arrangement.
Figure 11:
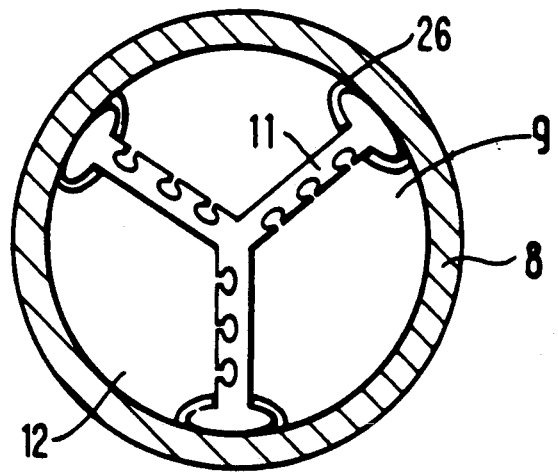

Finally FIGS. 10 and 11 show the screen 8 provided with recesses 25 and projections 26 for clamping the ends 12 of the arms 11 to the screen.

It will be understood that each of the elements described above, or two or more together, may also find a useful application in other types of constructions differing from the types described above.

While the invention has been illustrated and described as embodied in an arrangement for improving electromagnetic compatibility of an electrical device, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims.

1. An arrangement for improving the electromagnetic compatibility foam electrical device provided with an interference irradiation susceptible conduit, especially an electronic control device of an internal combustion engine of a power vehicle, comprising at least one screen; at least one conductor arranged inside said screen; and means for improving the electromagnetic compatibility by adjusting a capacity distributed between said at least one conductor and said screen, said improving means including holding means for holding said conductor at a predetermined, selectable distance from said screen in a mounted position, and a dielectric comprising a mass and stationary surrounding said conductor in said mounted position.

2. An arrangement as defined in claim 1; and further comprising at least one additional said conductor, said conductors being arranged at different distances from said screen.

3. An arrangement as defined in claim 1, wherein said holding means includes a plurality of holders spaced from one another.

4. An arrangement as defined in claim 1, wherein said holding means is mounted on said screen.

5. An arrangement as defined in claim 1, wherein said holding means has a receiving opening, said conductor extending through said receiving opening.

6. An arrangement as defined in claim 5, wherein said holding means has an edge and a plurality of openings open at said edge; and further comprising at least one additional such conductor, said conductors being firmly held in said openings of said holding means.

7. An arrangement as defined in claim 6, wherein said conductors are clamped in said openings of said holding means.

8. An arrangement as defined in claim 1; and further comprising at least one additional such conductor, said holding means including at least two holders provided with receiving openings, said conductors extending through said receiving openings of said holders.

9. An arrangement as defined in claim 1, wherein said holding means has a plurality of holders each provided with receiving openings offset relative to the receiving openings of other of said holders; and further comprising at least one additional such conductor, said conductors being arranged in said receiving openings of said holders so that their distances from said screen are different.

10. An arrangement as defined in claim 1, wherein said screen is formed by a hollow-profile-shaped chassis part.

11. An arrangement as defined in claim 1, wherein said screen is formed by a sheet bead of a reinforcing profile adaptable part of power vehicle.

12. An arrangement as defined in claim 1, wherein said screen is composed of ferromagnetic material.

13. An arrangement of improving the electromagnetic compatibility foam electrical device provided with an interference irradiation susceptible conduit, especially an electronic control device of an internal combustion engine of a power vehicle, comprising at least one conductor surrounded by a dielectric; at least one screen; holding means for holding said conductor at a predetermined, selectable distance from said screen in a mounted position; and said dielectric comprising a mass and surrounding said conductor in said mounted position, said mass of said dielectric being injection molded around said conductor.

14. An arrangement for improving the electromagnetic compatibility of an electrical device provided with an interference irradiation susceptible conduit, especially an electronic control device of an internal combustion engine of a power vehicle, comprising at least one conductor surrounded by a dielectric; at least one screen; holding means for holding said conductor at a predetermined, selectable distance from said screen in a mounted position; and said dielectric comprising a mass and surrounding said conductor in said mounted position; and means for clamping said holding means on said screen.

15. An arrangement as defined in claim 14, wherein said clamping means includes a plurality of recesses.

16. An arrangement as defined in claim 14, wherein said clamping means includes a plurality of projections.

17. An arrangement for improving the electromagnetic compatibility of an electrical device provided with an interference irradiation susceptible conduit, especially an electronic control device of an internal combustion engine of a power vehicle, comprising at least one conductor surrounded by a dielectric; at least one screen; holding means for holding said conductor at a predetermined, selectable distance from said screen in a mounted position; and said dielectric comprising a mass and surrounding said conductor in said mounted position, said screen being formed by a chassis part of a power vehicle.

18. An arrangement for improving the electromagnetic compatibility of an electrical device provided with an interference irradiation susceptible conduit, especially an electronic control device of an internal combustion engine of a power vehicle, comprising at least one conductor surrounded by a dielectric; at least one screen; holding means for holding said conductor at a predetermined, selectable distance from said screen in a mounted position; and said dielectric comprising a mass and surrounding said conductor in said mounted position, said screen being provided with at least one opening for adjusting a capacity or an inductivity of said conductor to an input impedance of the electrical device.

* * * * *